United States Patent
Pforr et al.

(10) Patent No.: US 6,627,392 B2
(45) Date of Patent: Sep. 30, 2003

(54) METHOD OF TRANSFERRING A PATTERN OF HIGH STRUCTURE DENSITY BY MULTIPLE EXPOSURE OF LESS DENSE PARTIAL PATTERNS

(75) Inventors: Rainer Pforr, Dresden (DE); Fritz Gans, München (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/073,846

(22) Filed: Feb. 11, 2002

(65) Prior Publication Data

US 2002/0110753 A1  Aug. 15, 2002

Related U.S. Application Data

(63) Continuation of application No. PCT/DE00/02653, filed on Aug. 9, 2000.

(30) Foreign Application Priority Data

Aug. 10, 1999  (DE) ......................................... 199 37 742

(51) Int. Cl.⁷ ............................... G03F 7/20; G03F 9/00
(52) U.S. Cl. ....................................... 430/394; 430/396
(58) Field of Search ......................... 430/5, 311, 394, 430/396, 322

(56) References Cited

U.S. PATENT DOCUMENTS

| 4,591,540 A | 5/1986 | Bohlen et al. |
| 5,576,126 A | * 11/1996 | Rolfson ......................... 430/5 |
| 5,604,059 A | 2/1997 | Imura et al. |
| 5,837,426 A | 11/1998 | Tseng et al. .................. 430/311 |
| 5,863,677 A | 1/1999 | Nakao ............................. 430/5 |
| 2001/0009751 A1 | 7/2001 | Wijnaendts et al. |

FOREIGN PATENT DOCUMENTS

| EP | 0 837 365 A1 | 4/1998 |
| JP | 57 072 327 A | 5/1982 |
| JP | 62 166 520 A | 7/1987 |

* cited by examiner

*Primary Examiner*—Kathleen Duda
(74) *Attorney, Agent, or Firm*—Laurence A. Greenberg; Werner H. Stemer; Gregory L. Mayback

(57) ABSTRACT

A pattern with small, densely packed structures is transferred from a structure carrier to an object. At least two partial patterns of less densely packed structure contents are produced from the densely packed structures in that those structures which are arranged close beside one another in the pattern on the structure carrier are assigned to various partial patterns if possible and separated from one another as a result. The partial patterns are then transferred to the object with a time offset and the structures are combined again as a result. This achieves a reduction in the structure density during the optical imaging process, so that the influence of disruptive structure interference on the imaging is reduced and thus denser structures can be imaged at the same wavelength.

12 Claims, 1 Drawing Sheet

METHOD OF TRANSFERRING A PATTERN OF HIGH STRUCTURE DENSITY BY MULTIPLE EXPOSURE OF LESS DENSE PARTIAL PATTERNS

CROSS-REFERENCE TO RELATED APPLICATION

This application is a continuation of copending International Application No. PCT/DE00/02653, filed Aug. 9, 2000, which designated the United States.

BACKGROUND OF THE INVENTION

Field of the Invention

The invention relates to a method of transferring a pattern with small, densely packed structures from a structure carrier to an object. Methods of this type are used to a great extent in the semiconductor industry for the manufacture of integrated circuits. They are, however, also employed outside semiconductor fabrication. Patterns in the context of this description may be geometric patterns, code or text symbols, image information, encrypted information, or other information which can be arranged in a surface. The structures contained in the pattern can be present on an electronic or physical structure carrier.

In semiconductor fabrication, patterns are produced on a reticle and projected from the latter onto a semiconductor substrate. In the process, the pattern on the reticle is transferred onto a layer of the semiconductor structure or a mask covering the latter, for example a mask of photo resist. In the simplest case, the pattern on the reticle consists of opaque and transparent regions; semitransparent regions are often also provided. Depending on the procedure, the exposed or the unexposed regions of the resist layer are removed, by which means the structure is transferred. Since the projected structures are generally small and very densely packed on the structure carrier, the optical imaging process necessarily leads to interference which is caused, in particular, by those structures which are arranged close beside one another in the pattern or on the structure carrier. In particular, first order diffraction maxima which mutually overlap easily lead to undesirable additionally exposed regions on the object in the case of a high structure density. Such side lobes are very pronounced, in particular in the case of masks with two-dimensional phase-shifting elements.

Conventional attempts to avoid such interference or at least to attenuate it were directed towards varying the opaqueness of semitransparent regions or varying the form of the pattern slightly with regard to the interference produced. In view of progressive miniaturization in semiconductor technology however, these measures prove to be unsatisfactory.

SUMMARY OF THE INVENTION

It is accordingly an object of the invention to provide a method of transferring a pattern with high-density structural detail, which overcomes the above-mentioned disadvantages of the heretofore-known devices and methods of this general type and with which undesired diffraction structures are suppressed or at least their intensity is attenuated to such an extent that the pattern to be transferred to the object agrees to a sufficient extent with the originally intended image.

With the foregoing and other objects in view there is provided, in accordance with the invention, a method of transferring a pattern from a structure carrier to an object, which comprises:

producing from a hole pattern of densely packed hole structures a plurality of partial patterns with less densely packed hole structure contents, and thereby assigning closely adjacent structures of the densely packed structures to different partial patterns and separating such closely adjacent structures from one another;

wherein a hole structure in one of the partial patterns comprises a fully transparent region, a phase-shifting frame surrounding the fully transparent region, and an opaque region surrounding the phase-shifting frame; and transferring the partial patterns to the object with an offset in time and thereby combining the structures to form the pattern of densely packed structures on the object.

In other words, the objects of the invention are achieved in that at least two partial patterns with less densely packed structure contents are produced from the structures of the pattern by those structures which are arranged close beside one another in the pattern or on the structure carrier being assigned to various partial patterns and, as a result, separated from one another, and in that the partial patterns are transferred to the object in a manner offset in time and, as a result, the structures are combined again. In this case, use is made of the fact that interference caused by various structures of the pattern is the weaker the further the structures are apart from one another. In view of the increasing compression of semiconductor structures on a substrate, the compression of structures on the structure carrier or the reticle cannot be avoided either. According to the invention, however, the pattern to be imaged is broken down into a plurality of complementary partial patterns, which are less compressed than the pattern itself and which are imaged onto the object or the substrate sequentially, that is to say one after another in time.

In accordance with a preferred embodiment of the invention, exactly two partial patterns are produced. This embodiment permits a particularly preferred development according to which structures of the pattern arranged periodically over a distance or area are assigned alternately to the two partial patterns. Very often, patterns consist of a large number of isolated structures which—formed as a transparent area in dark surroundings—are arranged on a two-dimensional point grid derived from a square, thus for example in the case of contact hole patterns in semiconductor fabrication. In the case of this type of patterns, the alternating assignment to the partial patterns, whose structures are separated from one another at least by a diagonal of the square, achieves a considerable dilution with a low number of partial patterns.

The partial patterns are preferably likewise generated on structure carriers. These structure carriers can be any desired two-dimensional structures, but electronic structure carriers, for example data carriers, are also considered. However, in the case of a transfer to a semiconductor substrate, the structure carriers are preferably lithographic masks, that is to say recticles.

Preferred embodiments provide for the mask to be a two-tone or three-tone mask and to have two-dimensional phase-shifting elements, and for the mask structures to consist exclusively of semitransparent phase-shifting material in the region used for the imaging. In particular in the case of phase masks, mask regions of varyingly high transparency are used to reduce interference. The two-dimensional phase-shifting elements generate a sudden phase change of 180°.

Within the context of semiconductor lithography, provision is made for the partial patterns to be produced on various reticles or various regions of a reticle, which are imaged, preferably optically, one after another onto the semiconductor substrate. Since in the case of the assignment according to the invention of the structures to less dense partial patterns, the minimum distance between structures and with said distance also optimal values of optical settings designed for this distance change, a development provides for the numerical aperture and the exposure of a projection system to be set, during the optical imaging process, to values which are optimum for the partial patterns. These settings are therefore not predefined or not merely predefined by the structure density of the pattern to be imaged, but depend substantially on the level of dilution of the structure density.

With regard to semiconductor fabrication, provision is preferably made for a large number of hole-like and/or gap-like structures to be transferred to the semiconductor substrate.

Other features which are considered as characteristic for the invention are set forth in the appended claims.

Although the invention is illustrated and described herein as embodied in a transferring a pattern of high structure density by multiple exposure of less dense partial patterns, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
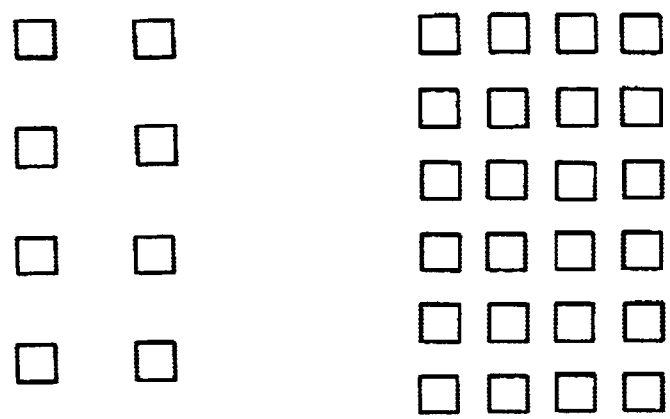
FIG. 1 is a diagrammatic plan view of two contact hole patterns with different contact hole densities.
Figure 1A:
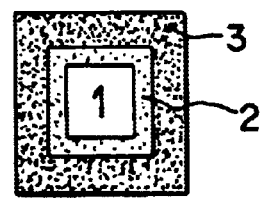
FIG. 1A is an enlarged diagrammatic plan view of an individual contact hole.

Referring now to the figures of the drawing in detail and first, particularly, to FIGS. 1 and 1A thereof, an individual contact hole comprises a fully transparent square 1, which is surrounded by a frame 2 of a semitransparent material causing a phase shift of 180°. This is adjoined on the outside by an opaque chromium layer 3. The two patterns consisting of a large number of such contact holes, which are illustrated schematically in FIG. 1, are likewise opaque in the regions between the respective contact holes. The distances between the contact holes should be selected in such a way that the annular first order diffraction maxima produced during the imaging in the left-hand, less dense pattern do not yet intersect and therefore do not yet lead to interfering additional structures. However, in the right-hand, denser pattern, as a result of interference between the first order diffraction maxima, a comparatively high light intensity is produced on a portion of the area at the point of intersection of the diagonals between adjacent contacts. The high light intensity forms an undesired structure in the photographic material.

Figure 2:
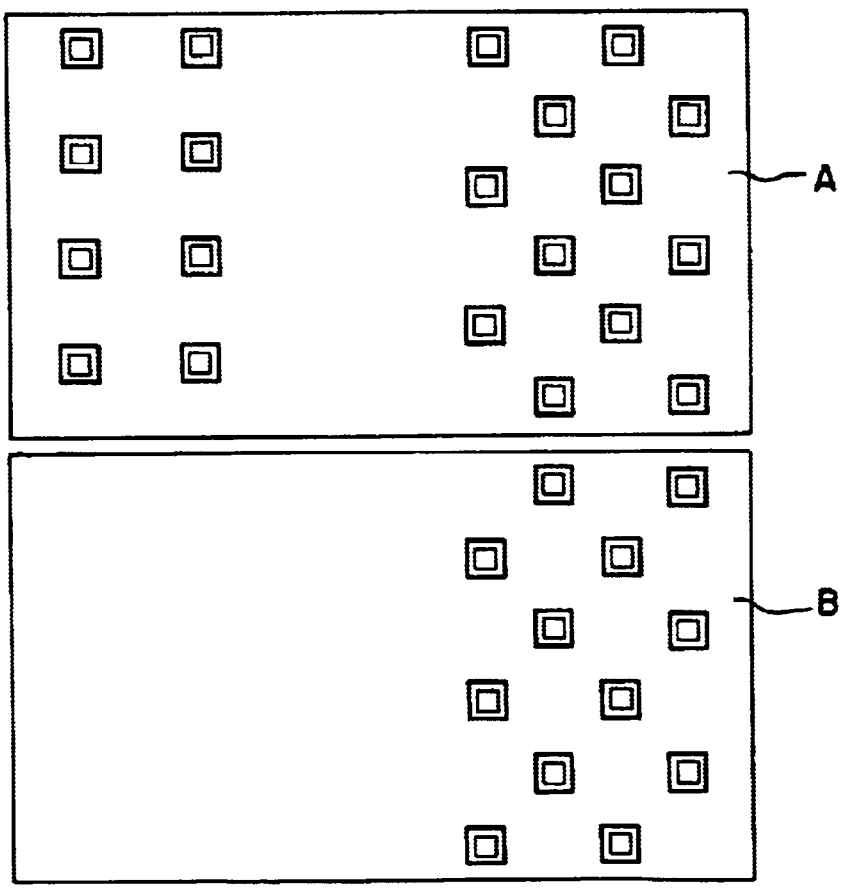
FIG. 2 is a plan view of two masks with a complementary pattern that results in the dense pattern on the right of FIG. 1.

In order to avoid this, the denser pattern is distributed to two mask regions or two masks, as shown in FIG. 2. The intensity rings of the first order diffraction maxima now overlap incoherently during sequential imaging, so that the intensity in the upper portion of the area is attenuated by one half. The mask regions A and B are imaged onto the substrate one after another, an offset correction, conventional in the case of steppers, being performed if required in order to avoid overlay errors. By means of this subdivision of closely adjacent, geometrically actually adjacent structures in an alternating sequence, the local structure density of the denser pattern from FIG. 1 is reduced by about 50%. Since the density of the sequence of structures, that is to say their positional frequency, is reduced according to the invention, the multiple exposure described can be used to achieve a greater integration density than in the case of a single exposure.

The number of part masks used and the type of allocation to the latter has to be modified in accordance with the pattern. Those skilled in the art will readily know how to choose the appropriate mask patterns and exposure steps within the principles of the foregoing description.

We claim:

1. A method of transferring a pattern from a structure carrier to an object, which comprises:
   producing from a hole pattern of densely packed hole structures a plurality of partial patterns with less densely packed hole structures, the hole structures in one of the partial patterns including a fully transparent region, a phase-shifting frame completely surrounding the fully transparent region, and an opaque region fully surrounding the phase-shifting frame, and thereby assigning closely adjacent structures of the densely packed hole structures to different partial patterns and separating such closely adjacent structures from one another; and
   transferring the partial patterns to the object with an offset in time and thereby combining the structures to form the pattern of densely packed structures on the object.

2. The method according to claim 1, wherein the producing step comprises producing two partial patterns.

3. The method according to claim 2, which comprises alternately assigning to the two partial patterns the structures of the pattern of the densely packed structures that are arranged periodically over a distance or area.

4. The method according to claim 1, wherein the producing step comprises producing the partial patterns on structure carriers.

5. The method according to claim 1, wherein the object is a semiconductor substrate and the structure carriers are lithography masks.

6. The method according to claim 1, wherein the structure carrier is a two-tone or three-tone mask formed with areal phase-shifting elements.

7. The method according to claim 1, wherein the producing step comprises forming partial patterns on various reticles, and the transferring step comprises imaging the various reticles onto the semiconductor substrate one after another.

8. The method according to claim 1, wherein the producing step comprises forming partial patterns on various regions of a reticle, and the transferring step comprises imaging the various regions of the reticle onto the semiconductor substrate one after another.

9. The method according to claim 1, wherein the object is a semiconductor substrate and the partial patterns are transferred to the semiconductor substrate by optical imaging.

10. The method according to claim 9, which comprises, during the optical imaging, setting a numerical aperture and an illumination of a projection system to values that are optimal for the partial patterns.

11. The method according to claim 9, wherein the transferring step comprises transferring a large number of hole structures to the semiconductor substrate.

12. The method according to claim 9, wherein the transferring step comprises transferring a large number of gap structures to the semiconductor substrate.

* * * * *